(12) United States Patent
Liu

(10) Patent No.: US 7,251,377 B2
(45) Date of Patent: Jul. 31, 2007

(54) CELL LIBRARY THAT CAN AUTOMATICALLY AVOID FORBIDDEN PITCHES

(75) Inventor: Hua-Yu Liu, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 833 days.

(21) Appl. No.: 10/426,545

(22) Filed: Apr. 29, 2003

(65) Prior Publication Data

US 2004/0218831 A1    Nov. 4, 2004

(51) Int. Cl.
*G06K 9/40* (2006.01)
(52) U.S. Cl. .................................... 382/274
(58) Field of Classification Search ........ 382/274–275, 382/254, 299, 141–151; 714/727, 724, 726; 716/17–20, 8, 3; 326/93; 327/94, 291; 257/347, 257/202; 710/25; 324/73.1, 158.1; 430/30

See application file for complete search history.

(56) References Cited

U.S. PATENT DOCUMENTS

| | | | | |
|---|---|---|---|---|
| 5,689,432 A | * | 11/1997 | Blaauw et al. | ................. 716/18 |
| 6,470,477 B1 | * | 10/2002 | Scott | ............................. 716/3 |
| 6,611,934 B2 | * | 8/2003 | Whetsel, Jr. | ................ 714/727 |
| 6,783,904 B2 | * | 8/2004 | Strozewski et al. | ........... 430/30 |

* cited by examiner

*Primary Examiner*—Ishrat Sherali
(74) *Attorney, Agent, or Firm*—Bever, Hoffman & Harms, LLP; Jeanette S. Harms

(57) ABSTRACT

Resolution enhancement techniques (RETs) aid in accurately transferring features on a layout to a wafer. Unfortunately, RETs may work well at one pitch but not another pitch. If image quality falls below an acceptable threshold at a certain pitch, then such a pitch is called a forbidden pitch. A cell library cell that can automatically avoid forbidden pitches is provided. In this method, evaluation points on edges of a feature in a cell can be analyzed based on a RET and a lithography model. Using this analysis, any forbidden pitch for the feature can be identified. Additionally, any forbidden pitch can be changed to an acceptable pitch, i.e. a pitch resulting in an acceptable image quality. The forbidden pitch information and the associated acceptable pitch information for the feature can be stored in a database to facilitate analyzing other features/cells.

23 Claims, 4 Drawing Sheets

CELL LIBRARY THAT CAN AUTOMATICALLY AVOID FORBIDDEN PITCHES

BACKGROUND OF THE INVENTION

1. Field of the Invention

The invention relates to generating a cell library and in particular to avoiding forbidden pitches for cells in the library based on a specific resolution enhancement technique (RET) and a lithography model, thereby significantly improving printed image quality.

2. Related Art

In designing an integrated circuit (IC), engineers typically rely upon computer aided design (CAD) tools to help create a circuit schematic design. To actually fabricate this circuit in a semiconductor substrate, the circuit must be translated into a physical representation, called a layout. In one design process, the CAD tools can access a cell library, wherein each cell can include the layout for a set of devices that implement a certain function.

After creation, the layout can be transferred onto a mask. A mask is generally created for each layer of the IC design. The mask can then be used to optically project the layout onto a silicon wafer coated with photoresist material. For each layer of the design, a light is shone on the mask corresponding to that layer. This light passes through the clear regions of the mask, whose image exposes the underlying photoresist layer, and is blocked by the opaque regions of the mask, leaving that underlying portion of the photoresist layer unexposed. The exposed photoresist layer is then developed. The end result is a wafer coated with a photoresist layer exhibiting the desired pattern, which defines the features of that layer. This process is repeated for each layer of the design.

In some circuits in which the size of the circuit features approach the optical limits of the lithography process, one or more resolution enhancement techniques can be used to improve the accuracy of the pattern transfer from the layout to the wafer. Specifically, as the size of integrated circuit features drops to 0.18 μ and below, the features can become smaller than the wavelength of the light used to create such features, thereby creating lithographic distortions when printing the features onto the wafer. Resolution enhancement techniques (RETs) can compensate for such lithographic distortions. Such resolution enhancement techniques (RETs) may include, for example, optical proximity correction, phase shifting, and off-axis illumination.

Optical proximity correction (OPC) applies systematic changes to geometries of the layout to improve the printability of a wafer pattern. Rule-based OPC can include rules to implement certain changes to the layout, thereby compensating for some lithographic distortions. Rule-based OPC features can include serifs, hammerheads, bias and assist bars. In model-based OPC, a real pattern transfer can be simulated (i.e. predicted) with a set of mathematical formulas (i.e. models). In model-based OPC, the edges of a feature in a layout can be dissected into a plurality of segments, thereby allowing these segments to be individually moved to correct for proximity effects.

In phase shifting, ultra-small features are generated by the destructive interference of light in adjacent, complementary pairs of phase shifters having opposite phase, e.g. 0 and 180 degrees. In one embodiment, the phase shifters can be formed on a phase shifting mask (PSM), which is used in conjunction with a trim mask that can define other features of the layout. In the PSM, complementary phase shifters are configured such that the exposure radiation transmitted by one shifter is 180 degrees out of phase with the exposure radiation transmitted by the other shifter. Therefore, rather than constructively interfering and merging into a single image, the projected images destructively interfere where their edges overlap, thereby creating a clear and very small image between the phase shifters.

The illumination that exposes the photoresist can be configured as on- or off-axis. A typical on-axis illumination configuration includes a single circular opening. Exemplary off-axis illumination configurations include dipole (two openings), quadrupole (four openings), and annular (donut shaped). In general, an on-axis illumination works well for designs having isolated features whereas off-axis illumination works well for designs having densely populated features.

Although significantly improving the wafer printability, these RETs can be pitch sensitive. Pitch can be defined as a distance between a centerline of one feature to the centerline of an adjacent feature. For example, referring to FIG. 1, the pitch of a design including features 101 and 102 can be represented by a distance 103.

Therefore, pitch is a relative measure of whether a design is characterized as having isolated features or densely populated features. Pitch can be represented as a ratio that compares the width of features to the space between the features. Thus, a 1:1 pitch may represent densely populated features whereas a 1:10 pitch may represent isolated features.

Unfortunately, when using a RET, certain pitches in a design may result in significant degradation of image quality. FIG. 2A illustrates a graph 200 plotting image quality using one RET versus pitch. In graph 200, a threshold 202 indicates a particular image quality (which could be measured by contrast, the size of a process window, the mask error factor, or other parameters) that can be deemed satisfactory by a wafer fabrication facility. Curve 201 shows that at approximately a 1:6 pitch, the image quality falls below threshold 202. Therefore, this pitch is called a "forbidden" pitch when using that RET.

Using each type of RET (or even configurations within one type of RET) may result in a different set of forbidden pitches. For example, FIG. 2B illustrates an exemplary graph 210 based on using another type of RET from that in FIG. 2A. Graph 210 indicates that using this other RET can result in multiple (i.e. two) forbidden pitches (curve 211 falls below threshold 202 at approximately 1:4 and 1:7). Note that the image quality using the RET of FIG. 2B is overall less than that provided by using the RET of FIG. 2A. However, the forbidden pitches associated with using the RET of FIG. 2B result in significantly less image quality degradation than the forbidden pitch associated with using the RET of FIG. 2A.

Image quality degradation could result in, for example, loss of feature density. Therefore, wafer fabrication facilities could decide to use the RET of FIG. 2B instead of that in FIG. 2A. In other words, certain fabrication facilities could conclude that the risk of having a severe forbidden pitch, such as that associated with the RET in FIG. 2A, in a design outweighs the printability benefits from using that RET. Therefore, wafer fabrication facilities may opt to not use such high risk RETs.

Another way of dealing with forbidden pitches is to limit allowable pitches in the library based on a plurality of design rules. Generally, process engineers manually generate these design rules based on empirical data. In this technique, library designers are not allowed to incorporate any forbidden pitches in the cells of the library. However, as noted above, one pitch may be a forbidden pitch using one type of RET, but not for another type of RET. Therefore, design rules for libraries can be overly aggressive for the actual RET being used, thereby potentially losing the printing benefits of using that RET.

Additionally, other factors in combination with the pitch can also affect the image quality. For example, two-dimensional (2D) factors such as the proximity, size, and/or shape of features near the feature of interest may affect image quality. For example, FIGS. 3A-3C respectively illustrate three features 301, 302, and 303 that are the same size and have the same pitch relative to other features in the design. However, depending on the RET being used, the image quality of features 301-303 when printed can be different. Current rule-based techniques cannot consider these 2D factors because the design rules precede library cell generation.

Therefore, a need arises for a technique to consider forbidden pitches during library cell generation in light of specific resolution enhancement techniques to be used.

SUMMARY OF THE INVENTION

Resolution enhancement techniques (RETs), which can be used during mask design and/or during chip fabrication, aid in accurately transferring features on a layout to a wafer. RETs may include, for example, optical proximity correction, phase shifting, and off-axis illumination. Unfortunately, RETs can be pitch sensitive, i.e. a RET may work well at one pitch but not another pitch. If image quality falls below an acceptable threshold at a certain pitch, then such a pitch is called a forbidden pitch. Forbidden pitches can vary from one RET to another.

Therefore, in accordance with one feature of the invention, a method of creating a library cell without a forbidden pitch is provided. This method includes selecting a feature of the library cell, creating evaluation points on edges of the feature, and performing analysis on the evaluation points based on a resolution enhancement technique (RET) and a certain process or optical model (called a lithography model herein).

Based on this analysis, any forbidden pitch for the feature can be identified. Then, also based on such analysis, any forbidden pitch can be changed to an acceptable pitch, i.e. a pitch resulting in an acceptable image quality. The forbidden pitch information and the associated acceptable pitch information for the feature can be stored in a database.

If all features in the library cell have been examined, then analysis of the library cell is complete. If another feature in the library cell has not been examined, then the method can include determining whether the pitch information regarding the other feature has already been stored. In other words, features having a similar width, length, and environment should have similar pitch information. Thus, if stored pitch information regarding the other feature is available, then this information can be accessed to determine whether the new feature's pitch is a forbidden pitch. If so, then the pitch can be changed to an acceptable pitch based on the stored pitch information.

In one embodiment, only critical features of the library cell may be analyzed. These critical features can be defined to include features having less than a predetermined critical dimension (CD), features having CDs within a predetermined CD range, features on a critical path for a device, and/or features providing a critical role for the device.

A method of creating a cell library accounting for forbidden pitches is also described. This method can include selecting a cell from the cell library, selecting a feature of the library cell, creating evaluation points on edges of the feature, and performing analysis on the evaluation points based on a resolution enhancement technique (RET) and a lithography model. Based on the analysis, any forbidden pitch for the feature can be identified. Any forbidden pitch can be modified to an acceptable pitch based on the analysis. Pitch information regarding the feature can be stored.

This analysis and pitch information storage can be performed for features having different width, lengths, and environments. If all cells in the library cell have been examined, then analysis of the cell library is complete. If another cell in the cell library has not been examined, then the method can include selecting the other cell and proceeding to selecting a feature in that cell.

A cell library is also described. The cell library can include a plurality of cells for designing an integrated circuit as well as pitch information regarding features in the cells. The pitch information can include a forbidden pitch for a feature and/or an associated acceptable pitch for that feature. The associated acceptable pitch can be computed based on a resolution enhancement technique and a lithography model, thereby ensuring an acceptable image quality for the feature when printed on the wafer. In one embodiment, this computation can include a simulation of the image quality of the feature.

A method of designing an integrated circuit is also provided. In this method, a cell library including a plurality of cells and pitch information regarding features in the plurality of cells can be accessed. Of importance a cell can be automatically selected based on a resolution enhancement technique, a lithography model, and the pitch information.

The pitch information can include a forbidden pitch for a feature and/or an associated acceptable pitch for that feature. In one embodiment, the pitch information can be generated by simulating the image quality of a subset of the features. The lithography model can include wavelength, numerical aperture, partial coherence, defocus, mask errors, and/or different exposures.

Computer software for creating a cell library is also described. This computer software can include code for implementing the above-described steps.

DETAILED DESCRIPTION OF THE DRAWINGS

Resolution enhancement techniques (RETs) are typically used on critical features of a circuit design to ensure that these features are accurately transferred from a layout to a wafer. These RETs can be pitch sensitive, i.e. a RET may work well at one pitch but not another pitch. If image quality falls below an acceptable threshold at a certain pitch, then such a pitch is called a forbidden pitch. Forbidden pitches can vary from one RET to another.

Currently, a mask design or wafer fabrication facility may not use a RET because of its associated forbidden pitches. Alternatively, cell libraries can simply exclude designs with any forbidden pitches. In either case, these facilities can potentially lose the printing benefits of using that RET.

Therefore, in accordance with one feature of the invention, the image quality of a feature in a library cell can be simulated based on a particular RET in combination with a specific process or optical model (called a lithography model herein). These simulations can identify forbidden pitches, which can then be advantageously modified during library cell generation. In this manner, mask design and/or chip fabrication facilities can gain any printing advantages from using that RET without the risk of using a forbidden pitch.

Figure 4:
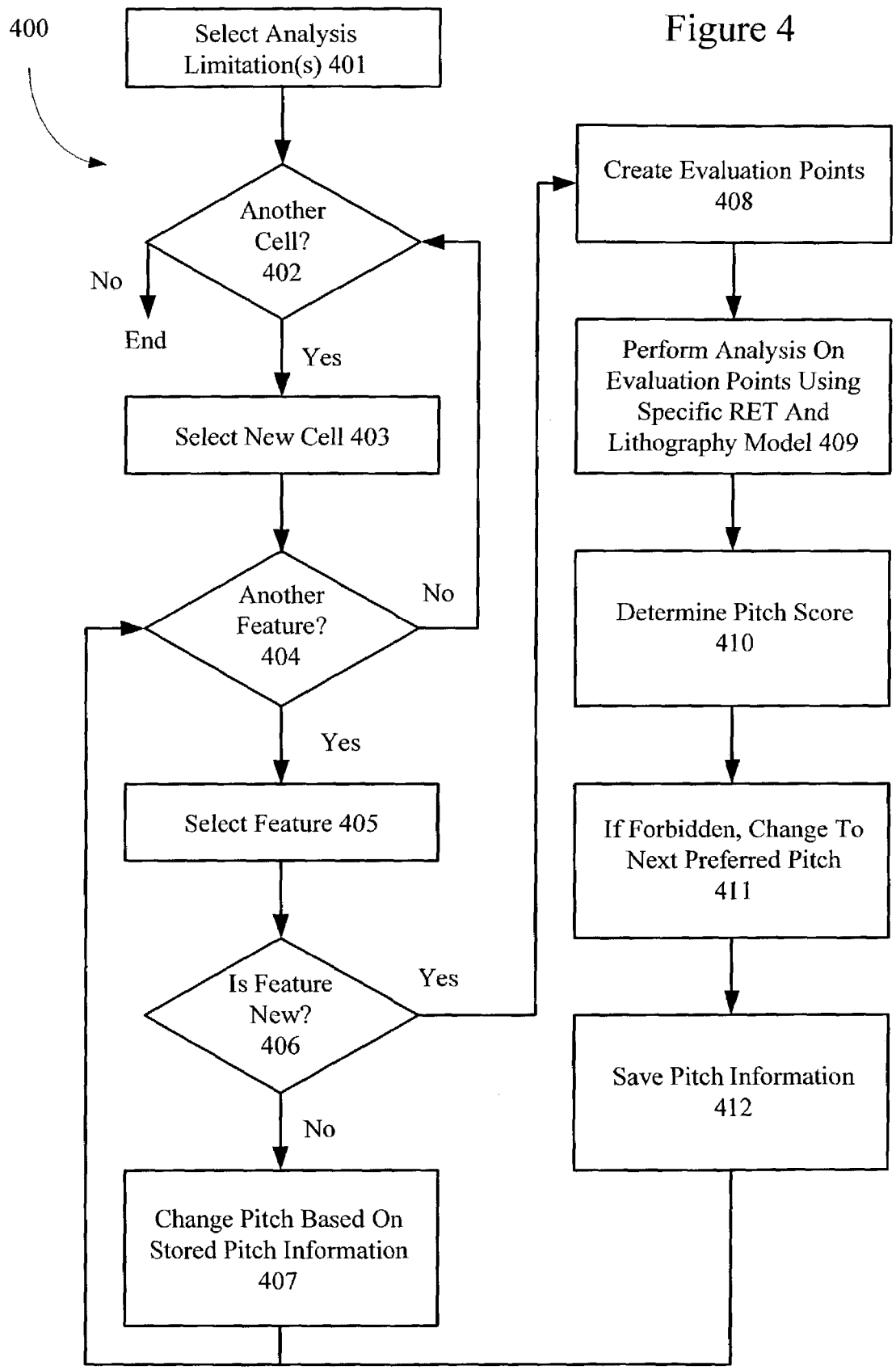
FIG. 4 illustrates a library generation process in which a forbidden pitch in a cell can be modified to another acceptable pitch.

FIG. 4 illustrates a library generation process 400 in which a forbidden pitch in a cell can be modified to an acceptable pitch. In one embodiment, the image quality of at least the critical features can be considered. Thus, in step 401, features having a particular critical dimension (CD) or a CD within a predetermined CD range from a cell library can be selected. For example, one selection process could limit the analysis of features in the library to features having CDs less than 0.13 μ. Alternatively, or in combination with the particular CD or the predetermined CD range, critical features can be defined as features on a critical path for a device and/or features providing a critical role for that device.

In step 402, a determination is made whether another cell in the library is unexamined. If all cells have been examined, then process 400 ends. Otherwise, a new cell is selected for analysis in step 403. In step 404, a determination is made whether another feature in that cell is not yet analyzed. If all features in that cell have been analyzed, then the process returns to step 402. Otherwise, a feature is selected for analysis in step 405.

In accordance with one feature of the invention, a feature (as defined by its shape, size, and environment) need only be analyzed once. After analysis, if the same feature is identified in another location in the cell or even in another cell, then the stored information regarding that feature can be used. Therefore, in step 406, a determination is made whether the selected feature is "new", i.e. a feature without associated stored information. In this manner, process 400 can be particularly time efficient in analyzing cells having repeating patterns.

If the feature is new, as determined in step 406, then process 400 proceeds to step 408 to create evaluation points on the selected feature. In this step, the edges of a feature can be dissected into a plurality of segments, thereby allowing these segments to be individually moved to identify and correct for forbidden pitches. This dissection can be similar to that performed in accordance with model-based OPC. In one embodiment, the placement of the dissection points can be determined by the feature shape, size, and/or position relative to other features. In other embodiments, a fixed dissection length can be used for edges, e.g. every N nm. In yet other embodiments, dissection points can be determined by exploring the optical proximity behavior along the edges based on simulation or wafer results.

After creating the evaluation points, an analysis can be performed on each evaluation point in step 409. The analysis can include simulations to generate image quality (e.g. process window or contrast) results based on a predetermined RET in combination with a certain lithography model (which could be provided by a user). Such an lithography model could include information regarding the stepper and optical conditions (e.g. numerical aperture, wavelength of illumination, and partial coherence) to be used in IC production as well as process variations, such as defocus, mask errors, and/or different exposures.

Based on this analysis, any forbidden pitches for that feature using the predetermined RET and lithography model can be identified in step 410, which determines a pitch score for that feature. In one embodiment, simulations of the evaluation points can be performed at predetermined (e.g. 50 nm) increments. Table 1 lists an exemplary set of values for certain parameters that can be generated by steps 409 and 410.

TABLE 1

FEATURES AND ASSOCIATED PITCH SCORES

| Feature Width | Feature Length | Environment | Pitch | Score |
|---|---|---|---|---|
| 100 nm | 500 nm | Line | 200 nm | 3 |
| 100 nm | 550 nm | Lines | 200 nm | 1* |
| 100 nm | 550 nm | Lines | 250 nm | 2** |
| 100 nm | 600–900 nm | None | 200 nm | 2 |
| 100 nm | 300 nm | Line + Contact | 200 nm | 3 |
| 100 nm | 350–550 nm | Line + Contact | 200 nm | 1* |
| 100 nm | 350–550 nm | Line + Contact | 250 nm | 2** |
| 100 nm | 350–550 nm | Line + Contact | 300 nm | 3 |
| 150 nm | 500 nm | Line + Partial Line | 300 nm | 3 |
| 150 nm | 500 nm | Lines | 300 nm | 2** |
| 150 nm | 500 nm | Lines | 350 nm | 1* |
| 150 nm | 500 nm | Lines | 400 nm | 3 |

In this embodiment, features can be defined by their width, length, and environment. An environment can be described by indicating one or more feature within a predetermined distance of the analyzed feature. These proximate features could be described as lines, partial lines, and contacts. In other embodiments, the environment could include other descriptors or use another system of describing the environment of the analyzed feature. Note that certain parameters, such as width, length, and pitch can be values and/or ranges of values. In yet other embodiments of the invention, the table could be built using pattern matching instead of parameter values/descriptors.

Figure 1:
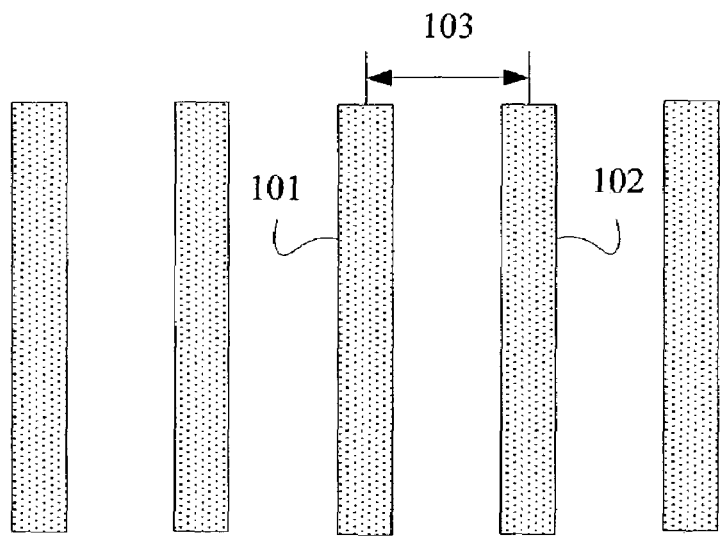
FIG. 1 illustrates the pitch of a simple layout.
Figure 2A:
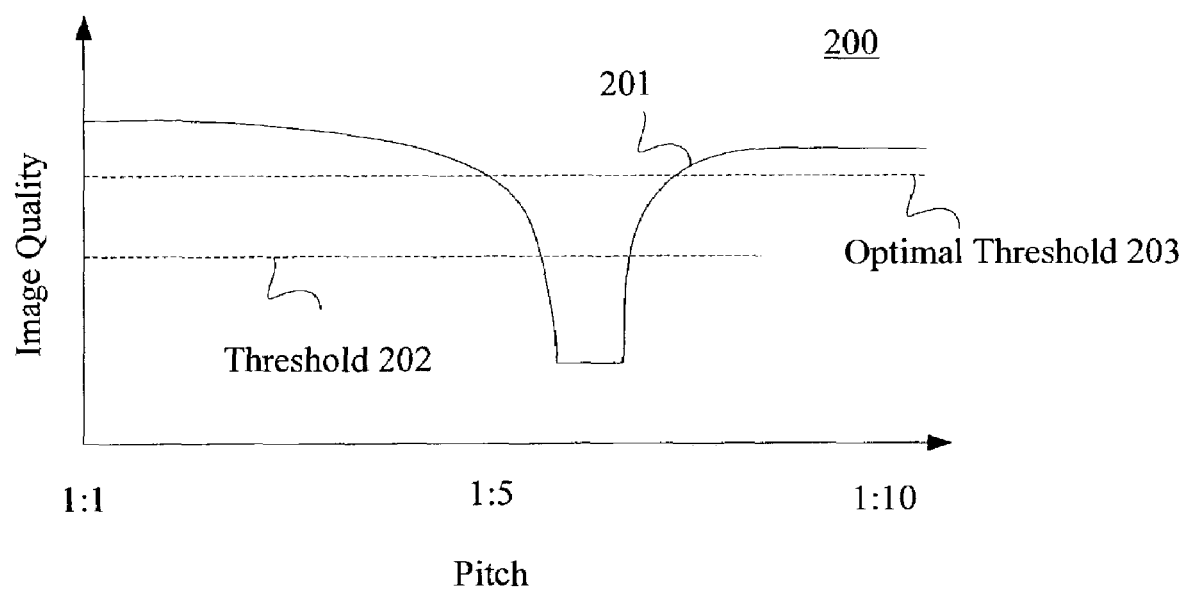
FIG. 2A illustrates a graph plotting image quality using one RET versus pitch. This RET has an associated forbidden pitch range.
Figure 2B:
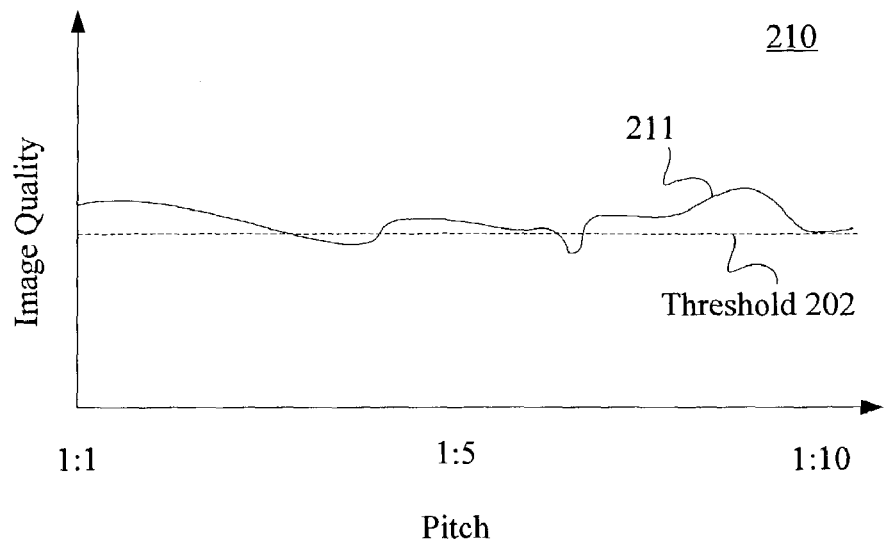
FIG. 2B illustrates an exemplary graph based on using another type of RET having multiple forbidden pitch ranges.
Figures 3A, 3B, 3C:
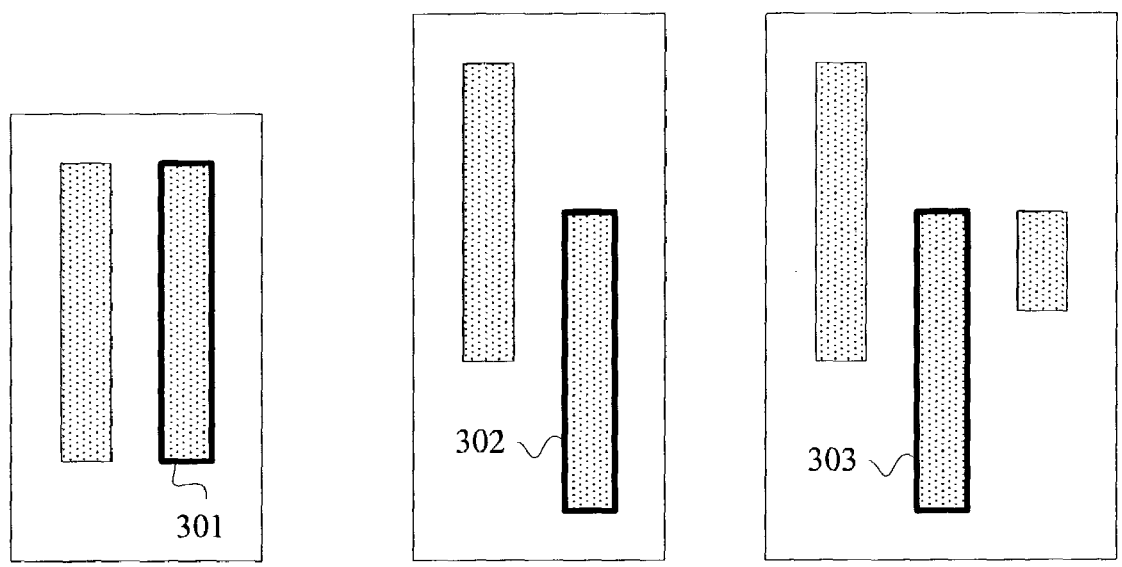
FIGS. 3A-3C illustrate three features that are the same size and have the same pitch relative to other features in the design, but may print differently depending on the RET being used.

In Table 1, the score of the associated pitch can be indicated by a numerical system including 1, 2, and 3, wherein 1 indicates an image quality less than the threshold (i.e. a forbidden pitch), 2 indicates an image quality above the threshold up to a predetermined optimal threshold (see, for example, an optimal threshold 203 in FIG. 2A), and 3 indicates an image quality above the predetermined optimal threshold. In other embodiments of the invention, a designation of either "acceptable" or "not acceptable" can be used. In yet other embodiments, other designations can be used, wherein the designations can at least differentiate between forbidden pitches and acceptable pitches.

In accordance with one aspect of the invention, for every forbidden pitch identified, another acceptable pitch (i.e. another pitch having an image quality above the threshold) can be determined for that feature. In one embodiment, the other acceptable pitch can be the closest acceptable pitch to the forbidden pitch. For example, in Table 1, a feature having a width of 100 nm, a length of 550 nm, and being proximate to a plurality of lines has a forbidden pitch of 200 nm (indicated by a score of 1). In this case, the analysis performed on the evaluation points of the feature (step 409 in FIG. 4) can provide at least one other entry in Table 1 (in this case, the row immediately below) wherein a substantially identical feature (i.e. having substantially the same width, length, and environment) has a pitch that ensures an image quality above the threshold (i.e. a score of 2 or 3). Specifically, this feature has a pitch of 250 nm and a score of 2.

The goal of storing the pitch information, such as that provided by Table 1, is to, without further simulation, efficiently change a forbidden pitch of a feature in a library cell to an acceptable pitch that minimizes impact to the cell (and thus ultimately to a user's design) in step 411. In one embodiment, if the two acceptable pitches are below and above the forbidden pitch by the same amount, then the smaller pitch can be designated as the next preferred pitch (assuming that this pitch conforms to standard design rules). For example, in Table 1, the last three entries list three features that are substantially identical except for pitch. If an analyzed feature has a pitch of 350 nm, i.e. a forbidden pitch, then the next preferred pitch would be 300 nm, not 200 nm. In this manner, the overall size of the cell can be minimized. In another embodiment, if the two acceptable pitches are below and above the forbidden pitch by the same amount, then the pitch providing the better image quality can be designated as the next preferred pitch. For example, referring once again to the last three entries in Table 1, if the analyzed feature has a pitch of 350 nm, then the next preferred pitch would be 400 nm, not 300 nm.

The identification of forbidden pitches and their respective next preferred pitches can be saved in step 412. In one embodiment, the pitches of all analyzed substantially unique features can be stored. Thus, when process 400 returns to step 404, only new features are analyzed in subsequent step 406.

If the feature is not new, i.e. the feature has associated stored information, then the pitch of the feature can be changed, if necessary, to that stored in the table in step 407. In one embodiment, the pitch of the feature is changed if that pitch is a forbidden pitch. Otherwise, the pitch of the feature is not changed. After changing the pitch, if necessary, the process can return to step 404 to determine if another feature in the cell can be examined.

Logically, as more features and thus more cells of the library are analyzed, the stored pitch information grows. Of importance, because many features can be found in one cell and/or multiple cells, the time needed for feature analysis (i.e. steps 409 and 410) can take less time for each cell. In other words, a first cell including, for example, 100 features could have only 30 substantially unique features (i.e. having the same or substantially same width, length, and environment). A second cell including the same number of features could have 20 substantially unique features of which 10 features could already have stored pitch information based on the analysis of the first cell. Thus, the time to analyze each succeeding cell (i.e. steps 402-412) and even each succeeding feature (steps 408-412) may decrease dramatically in process 400.

Figure 5:
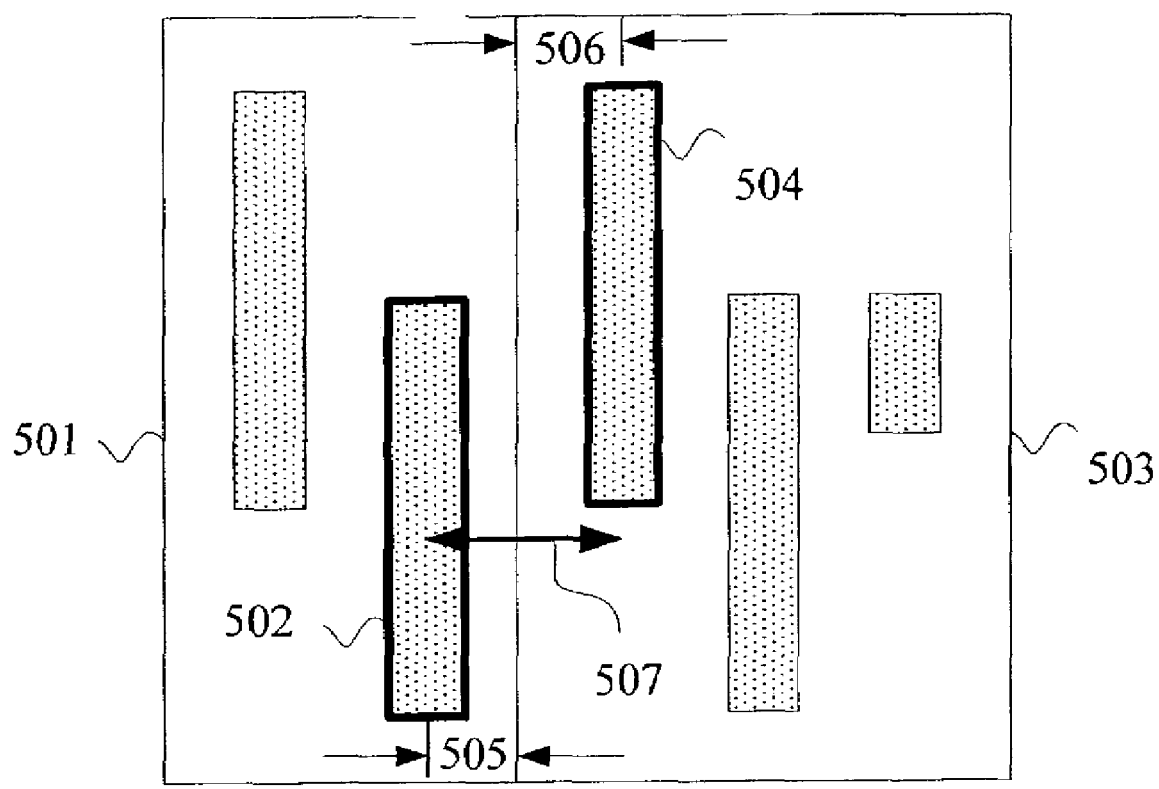
FIG. 5 illustrates one cell configuration in which the proximity of a feature to a cell boundary can be modified based on the forbidden pitch.

In typical cell libraries, features do not extend from one cell into another cell. In other words, each cell is generally self-contained. In one embodiment, the proximity of a feature to a cell boundary can be modified based on the forbidden pitch. For example, in FIG. 5, a centerline of a feature 502 is positioned a distance 505 from the boundary of cell 501, whereas a centerline of a feature 504 is positioned a distance 506 from the boundary of cell 503. In accordance with one aspect of the invention, distance 505 and/or distance 506 can be modified, if necessary, to ensure that a pitch 507 could not be the forbidden pitch for either feature 502 or feature 504. In one embodiment, modifying distances 505/506 could include increasing a size of at least one of cells 501/503. In this case, the size of adjacent cells could be decreased to ensure that the overall size of the design remains constant. In another embodiment, modifying distances 505/506 could include moving features 502/504 and potentially other adjacent features within cells 501/503.

Although illustrative embodiments of the invention have been described in detail herein with reference to the figures, it is to be understood that the invention is not limited to those precise embodiments. They are not intended to be exhaustive or to limit the invention to the precise forms disclosed. As such, many modifications and variations will be apparent. For example, the pitch information could refer to various RETs and lithography models. In this case, a user input indicating the applicable RET and lithography model could be used to select the appropriate pitch for a particular feature. In this manner, the computed pitch information from one cell library could be applicable to many cell libraries.

Note that the system and methods described herein can be applied to any lithographic process technology, including ultraviolet, deep ultraviolet (DUV), extreme ultraviolet (EUV), x-ray, and ebeam. Accordingly, it is intended that the scope of the invention be defined by the following claims and their equivalents.

The invention claimed is:

1. A method of creating a library cell without a forbidden pitch, the method comprising:
   selecting a feature of the library cell;
   creating evaluation points on edges of the feature;
   performing analysis on the evaluation points based on a resolution enhancement technique (RET) and a lithography model;
   identifying any forbidden pitch for the feature based on the analysis;
   modifying any forbidden pitch to an acceptable pitch based on the analysis; and
   storing pitch information regarding the feature.

2. The method of claim 1, further including determining whether another feature in the library cell can be examined, wherein if so, then determining whether pitch information regarding the other feature has been stored, and wherein if not, then ending creating the library cell.

3. The method of claim 2, wherein if pitch information regarding the other feature has been stored, then accessing the stored pitch information.

4. The method of claim 3, wherein if a pitch of the other feature is a forbidden pitch, then changing the pitch to an acceptable pitch based on the stored pitch information.

5. The method of claim 1, wherein selecting is limited to critical features of the library cell.

6. The method of claim 5, wherein critical features include at least one of a feature having less than a predetermined critical dimension (CD), a feature having a CD within a predetermined CD range, a feature on a critical path for a device, and a feature providing a critical role for the device.

7. A method of creating a cell library that automatically avoids forbidden pitches, the method comprising:
   selecting a cell from the cell library;
   selecting a feature of the library cell;

creating evaluation points on edges of the feature;
performing analysis on the evaluation points based on a resolution enhancement technique (RET) and a lithography model;
identifying any forbidden pitch for the feature based on the analysis;
modifying any forbidden pitch to an acceptable pitch based on the analysis; and
storing pitch information regarding the feature.

8. The method of claim 7, further including determining whether another feature in the library cell can be examined,
wherein if so, then determining whether pitch information regarding the other feature has been stored, and
wherein if not, then ending the creation of the library cell.

9. The method of claim 7, wherein if pitch information regarding the other feature has been stored, then accessing the stored pitch information.

10. The method of claim 9, wherein if a pitch of the other feature is a forbidden pitch, then changing the pitch to an acceptable pitch based on the stored pitch information.

11. The method of claim 7, wherein selecting is limited to critical features of the library cell.

12. The method of claim 11, wherein critical features include at least one of a feature having less than a predetermined critical dimension (CD), a feature having a CD within a predetermined CD range, a feature on a critical path for a device, and a feature providing a critical role for the device.

13. The method of claim 7, further including determining whether another cell in the cell library can be examined,
wherein if so, then selecting the other cell and proceeding to selecting a feature in that cell, and
wherein if not, then ending the creation of the cell library.

14. A method of designing an integrated circuit, the method comprising:
accessing a cell library including a plurality of cells and pitch information regarding features in the plurality of cells; and
automatically selecting a cell based on a resolution enhancement technique, a lithography model, and the pitch information.

15. The method of claim 14, wherein the pitch information includes a forbidden pitch for a feature and an associated acceptable pitch.

16. The method of claim 14, wherein the lithography model includes at least one of wavelength, numerical aperture, partial coherence, defocus, mask error, and exposure.

17. The method of claim 14, wherein the pitch information is generated by simulating image quality of a subset of the features.

18. A computer software for creating a cell library, the computer software being stored on a computer-readable medium, the computer software comprising:
code for selecting a cell from the cell library;
code for selecting a feature of the library cell;
code for creating evaluation points on edges of the feature;
code for performing analysis on the evaluation points based on a resolution enhancement technique (RET) and a lithography model;
code for identifying any forbidden pitch for the feature based on the analysis;
code for modifying any forbidden pitch to an acceptable pitch based on the analysis; and
code for storing pitch information regarding the feature.

19. The computer software of claim 18, further including code for determining whether another feature in the library cell can be examined,
wherein if so, then code for determining whether pitch information regarding the other feature has been stored, and
wherein if not, then code for ending the creation of the library cell.

20. The computer software of claim 19, wherein if pitch information regarding the other feature has been stored, then code for accessing the stored pitch information.

21. The computer software of claim 20, wherein if a pitch of the other feature is a forbidden pitch, then code for changing the pitch to an acceptable pitch based on the stored pitch information.

22. The computer software of claim 18, wherein the code for selecting includes code for selecting only critical features of each library cell.

23. The computer software of claim 18, further including code for determining whether another cell in the cell library can be examined,
wherein if so, then code for selecting the other cell and proceeding to selecting a feature in that cell, and
wherein if not, then code for ending the creation of the cell library.

* * * * *